United States Patent [19]

Bland et al.

[11] Patent Number: 5,107,507
[45] Date of Patent: Apr. 21, 1992

[54] BIDIRECTIONAL BUFFER WITH LATCH AND PARITY CAPABILITY

[75] Inventors: Patrick M. Bland; Mark E. Dean, both of Delray Beach, Fla.; Gene J. Gaudenzi, Purdys, N.Y.; Kevin G. Kramer, Wappingers Falls, N.Y.; Susan L. Tempest, Poughkeepsie, N.Y.

[73] Assignee: International Business Machines, Armonk, N.Y.

[21] Appl. No.: 198,961

[22] Filed: May 26, 1988

[51] Int. Cl.⁵ .............................................. G06F 11/10
[52] U.S. Cl. .................................................. 371/49.1
[58] Field of Search ................... 371/29.5, 40.4, 49.1, 371/49.2, 51.1

[56] References Cited

U.S. PATENT DOCUMENTS

| | | | |
|---|---|---|---|
| 2,873,363 | 2/1959 | Wanlass | 307/446 |
| 2,951,951 | 9/1960 | Morgan | 307/475 |
| 3,112,413 | 11/1963 | Zimbel | 307/480 |
| 3,170,075 | 2/1965 | Mellott | 307/288 |
| 3,192,362 | 6/1965 | Cheney | 371/49.1 X |
| 3,215,852 | 11/1965 | Brode et al. | 307/273 |
| 3,231,763 | 1/1966 | Mellott | 307/272.1 |
| 3,283,175 | 11/1966 | Webb | 307/292 |
| 3,324,307 | 6/1967 | Mellot et al. | 307/247.1 |
| 3,421,026 | 1/1969 | Stopper | 307/289 |
| 3,424,923 | 1/1969 | Mellott | 307/247.1 |
| 3,602,733 | 8/1971 | Aoki | 307/473 |
| 3,805,233 | 4/1974 | Steadman | 371/49.1 |
| 3,824,408 | 7/1974 | Brunel | 307/457 |
| 3,914,628 | 10/1975 | Pao et al. | 307/463 X |

(List continued on next page.)

FOREIGN PATENT DOCUMENTS

| | | |
|---|---|---|
| 0154330 | 9/1985 | European Pat. Off. |
| 147807 | 9/1983 | Japan . |
| 148199 | 8/1984 | Japan . |

OTHER PUBLICATIONS

Carinalli et al., "Expandable IC Finds and Fixes Errors Fast", *Electronic Design*, Feb. 18, 1982, pp. 177–186.
IBM Technical Disclosure Bulletin, vol. 16, No. 10, Mar. 1974, p. 3249.
IBM Technical Disclosure Bulletin, vol. 14, No. 3, Aug. 1971, pp. 804–805.
IBM Technical Disclosure Bulletin, vol. 27, No. 4A, Sep. 1984, pp. 2140–2148.
IBM Technical Disclosure Bulletin, vol. 27, No. 10B, Mar. 1985, pp. 6316–6317.
Patent Abstracts of Japan, vol. 9, No. 167 (P-372) (1980), Jul. 12, 1985.
Patent Abstracts of Japan, vol. 11, No. 103 (P-562) (2550), Apr. 2, 1987.
Jacob Millman: "Microelectronics: Digital & Analog Circuits and Systems", 1979, p. 109, International Student Edition, McGraw-Hill, Inc., Singapore.

*Primary Examiner*—Jerry Smith
*Assistant Examiner*—David Huntley
*Attorney, Agent, or Firm*—Jeffrey L. Brandt

[57] ABSTRACT

A circuit for buffering and parity checking digital data communicated between first and second data buses includes a plurality of bidirectional bit buffer circuits. Each of the bidirectional bit buffer circuits includes: a first data path comprising a data receiver, latch, and driver connected in series between the first and second data buses, respectively; a second data path comprising a data receiver, latch and driver connected in series between the second and first data buses, respectively; control mechanisms for controlling the drivers to selectively place the output of the drivers in an active driving or high impedance state; and control mechanisms for controlling the data latches to selectively latch or pass through data. A parity generating circuit is connected at the output of the latch in the first data path of each of the bidirectional bit buffer circuits for generating a parity bit responsive to the data at the output of these latches. A transparent latch and driver circuit with phase splitter are provided for increasing the speed of the circuit without substantially increasing the power requirements.

10 Claims, 4 Drawing Sheets

U.S. PATENT DOCUMENTS

| | | | |
|---|---|---|---|
| 4,031,412 | 6/1977 | Ohhinata et al. | 307/287 |
| 4,044,271 | 8/1977 | Symanski et al. | 307/475 |
| 4,163,997 | 8/1979 | Schroeder et al. | 360/137 |
| 4,199,731 | 4/1980 | Taylor et al. | 330/262 |
| 4,251,884 | 2/1981 | Baun, Jr. | 371/49.2 |
| 4,287,433 | 9/1981 | Goodspeed | 307/473 |
| 4,311,927 | 1/1982 | Ferris | 307/473 |
| 4,357,547 | 11/1982 | Espe et al. | 307/272.2 |
| 4,409,189 | 2/1983 | Okhasi | 423/54 |
| 4,429,391 | 1/1984 | Lee | 371/49.1 |
| 4,462,102 | 7/1984 | Povlick | 371/49.2 |
| 4,477,904 | 10/1984 | Thorarud | 371/49.2 |
| 4,485,470 | 11/1954 | Reali | 370/112 |
| 4,498,175 | 2/1985 | Nagumo et al. | 371/37.5 |
| 4,528,465 | 7/1985 | Harvey | 307/454 |
| 4,592,023 | 5/1986 | Beranger et al. | 365/233 |
| 4,608,693 | 8/1986 | Baranyai et al. | 371/49.2 |
| 4,614,884 | 9/1986 | Nagano | 307/475 |
| 4,639,917 | 1/1987 | Farota | 371/16.5 |
| 4,646,312 | 2/1987 | Goldsbury et al. | 371/40.1 |
| 4,661,727 | 4/1987 | Ferris et al. | 307/456 |
| 4,670,876 | 6/1987 | Kirk | 371/3 |
| 4,672,242 | 6/1987 | Teymouri | 307/473 |
| 4,682,050 | 7/1987 | Beranger et al. | 307/542 X |
| 4,682,052 | 7/1987 | Kyomasu | 307/361 |
| 4,685,088 | 8/1987 | Iannucci | 365/189.02 |
| 4,697,103 | 9/1987 | Ferris et al. | 307/456 |
| 4,707,623 | 11/1987 | Bismark | 307/475 |
| 4,710,934 | 12/1987 | Traynor | 371/40.1 |
| 4,710,935 | 12/1987 | Kim et al. | 371/49.2 |
| 4,730,132 | 3/1988 | Watanabe et al. | 307/446 |
| 4,746,818 | 5/1988 | Hafner | 307/363 |
| 4,763,303 | 8/1988 | Flannagan | 365/189.01 |
| 4,872,172 | 10/1989 | Sanner | 371/49.1 |

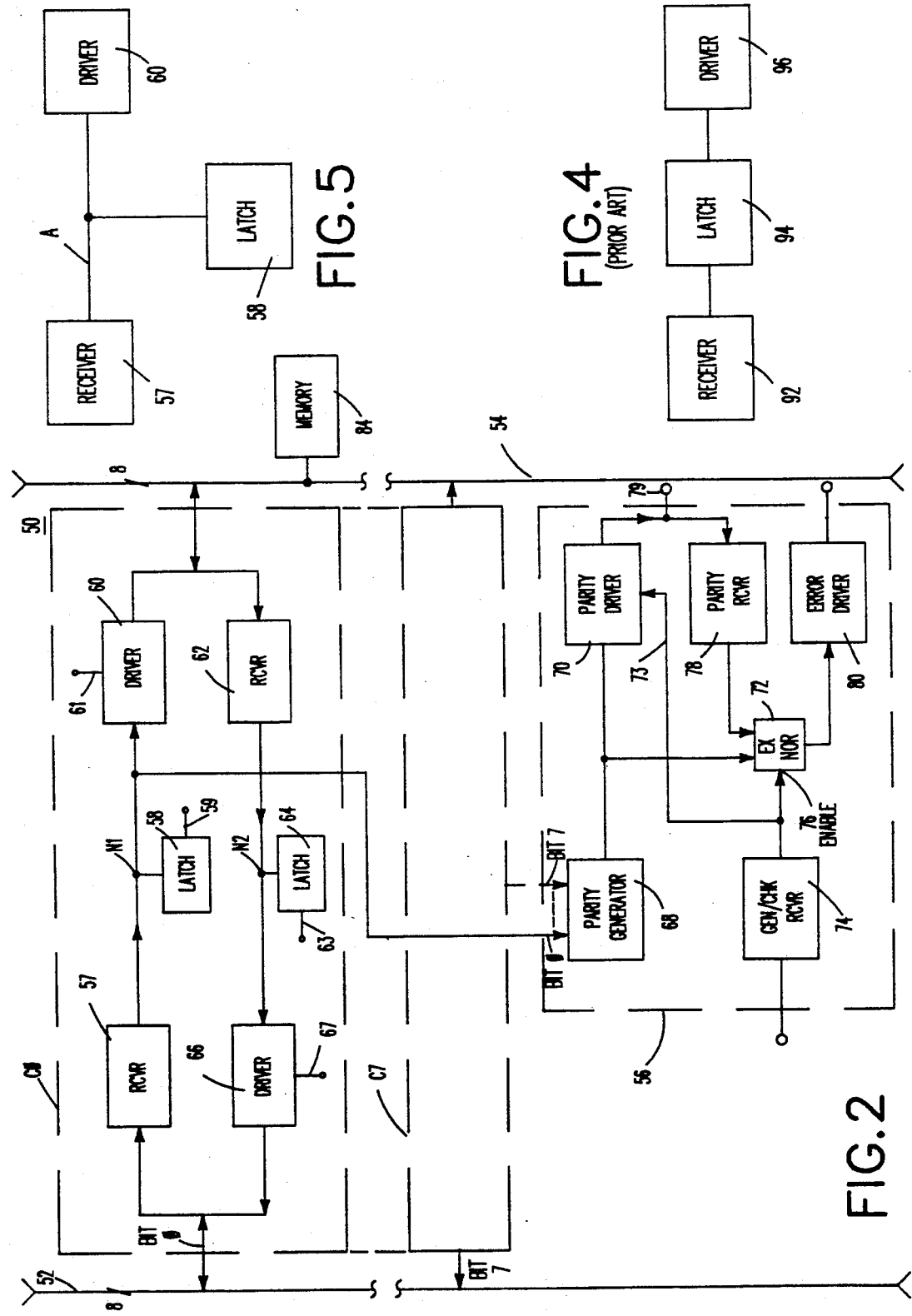

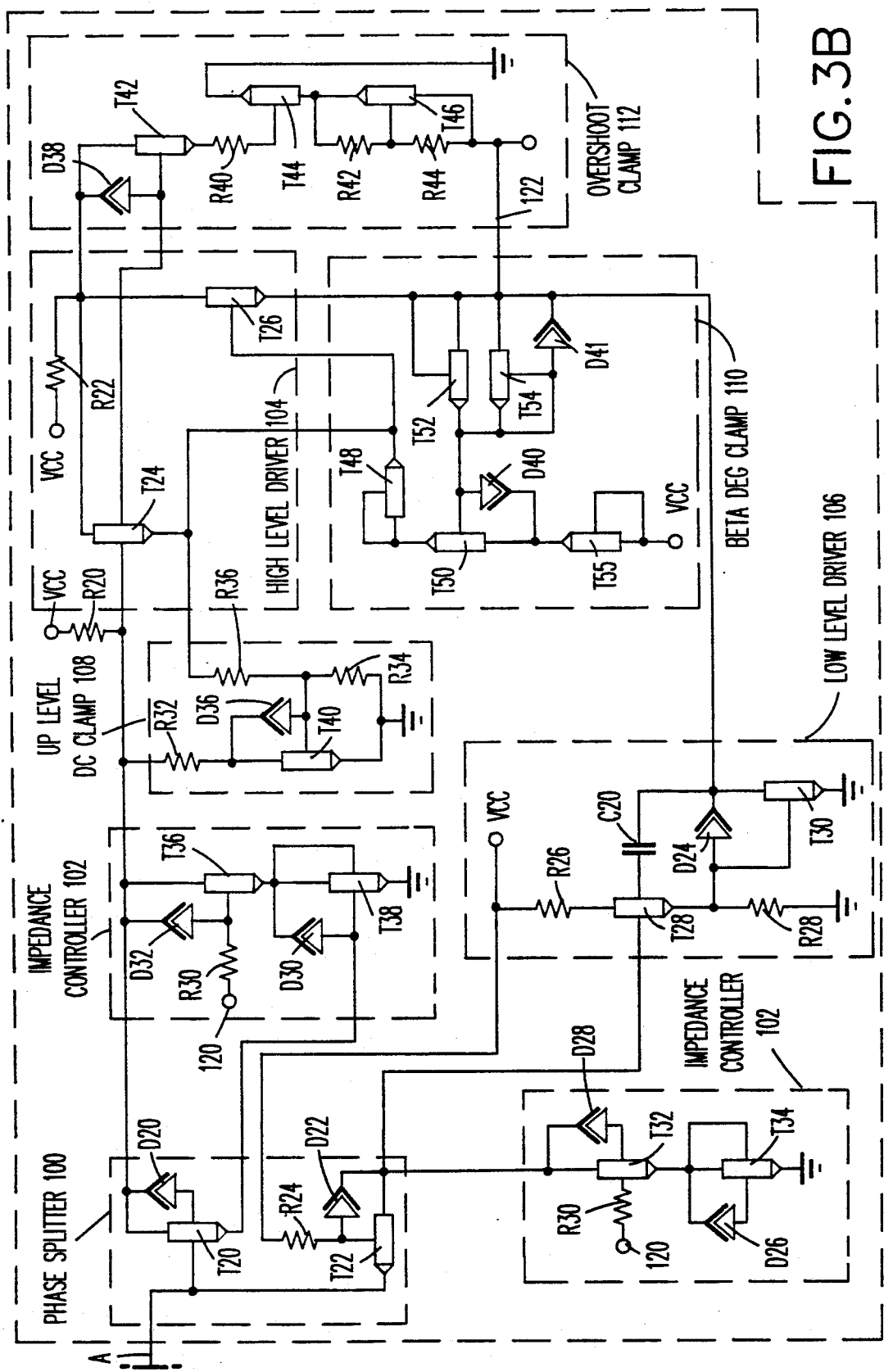

BIDIRECTIONAL BUFFER WITH LATCH AND PARITY CAPABILITY

CROSS-REFERENCE TO RELATED APPLICATIONS

The present application is related to co-pending U.S. patent application Ser. No. 07/196,721, filed on the same date herewith.

TECHNICAL FIELD OF THE INVENTION

The present invention relates generally to digital signal processing circuits and more specifically to a bidirectional receiver/driver buffer circuit incorporating a latch and circuit apparatus for both generating and verifying parity as a function of the data at the latch.

BACKGROUND OF THE INVENTION

Referring first to FIG. 1, a circuit 10 is shown for bidirectionally buffering digital signals between, for example, first and second digital signal buses 12, 14. For purposes of explanation, buses 12, 14 will be described as 8 bit data buses.

Circuit 10 includes eight, generally parallel connected, bidirectional bit buffer circuits, indicated at B0-B7. Bit buffer circuits B0-B7 are identical in construction, and only circuit B0 is described and shown in detail herein.

Bit buffer circuit B0 comprises two generally parallel bit buffer paths, the first path comprising a receiver 16, latch 18, and driver 20 connected seriatim. In the second of the bit buffer paths, a receiver 22, latch 24, and driver 26 are also connected seriatim, and in opposite order to the corresponding components of the first path. Receivers 16, 22 comprise conventional logical bit receivers. Drivers 20, 26 comprise conventional logical bit drivers, each including a control terminal 28, 30, respectively, for selectively placing the output in an active or a high-impedance state. Latches 18, 24 comprise conventional transparent latches, each including a control terminal 32, 34, respectively, for selectively placing the latch in a latched or pass-through (i.e. transparent) state.

A parity generator 36 is provided, the inputs of the parity generator being connected to the inputs of receivers 16 in each of circuits B0-B7. Parity generator 36 comprises a conventional parity "tree" of logical exclusive-OR gates. For purposes of explanation, a memory device 38, for example a dynamic random access memory (RAM), is shown connected to data bus 14.

In operation, circuit 10 functions generally to bidirectionally buffer data between buses 12 and 14. In one exemplary application, buses 12, 14 function as local data buses in a computer system (not shown), with bus 12 interfacing a microprocessor and bus 14 interfacing memory 38. In accordance with its buffering function, when data is to be communicated from bus 12 to bus 14, an appropriate signal is applied to control terminal 30 so as to place driver 26 in a high impedance state. Data, in the form of a high or low logical bit 0, is sensed by receiver 16 and converted to another logical level (i.e. 1 or 0). Receiver 16 thus functions in a standard manner to convert widely ranging levels of input signals to narrower ranging levels of output signals. A signal is applied to control terminal 32 for appropriately latching or passing bit 0 through latch 18. The data at the output of latch 18 is then sensed by driver 20, which is controlled via terminal 28 so as to be in the active mode for driving bus 14. Data is transmitted in substantially the identical manner from bus 14 to bus 12 via the path including receiver 22, latch 24, and driver 26.

Parity generator 36 provides the capability to generate a parity bit responsive to the data on bus 12. When such parity generation is desired, the data on bus 12 is frozen for a time sufficient to permit parity generator 36 to operate on the data and generate the parity bit. Parity generator 36 further provides the capability to generate a parity bit responsive to the data on bus 14, with the data either being latched in or passed through latch 24.

When applied in a computer environment of the type described above, circuit 10 exhibits the substantial disadvantage of interrupting data transmission on bus 12 whenever it is desired to generate a parity bit. More specifically, when parity is generated responsive to data on bus 12, the data must be frozen on bus 12 for a time sufficient to allow parity generator 36 to function. Similarly, when it is desired to generate a parity bit responsive to the data on bus 14, the data must be frozen on bus 14 or latched in latch 24. In either of these conditions, the data is present at the output of driver 26, and thus it is necessary to interrupt data transmission on bus 12.

SUMMARY OF THE INVENTION

A principal object of the present invention is to provide apparatus for buffering and parity checking digital data communicated between two data buses which permits parity to be generated responsive to the data without interrupting either of the data buses.

Another object of the present invention is to provide such an apparatus including new and improved latch and driver circuits which provide increased speed of operation.

A further object of the present invention is to provide a truly transparent latch circuit which provides latching of data without imposing any significant delay between input and output devices.

Yet another object of the present invention is to provide a driver including a phase splitter circuit which provides the driver with increased speed but requires no significant increase in power consumption.

In accordance with the present invention, there is provided apparatus for buffering and parity checking digital data communicated between first and second data buses, comprising: a plurality of bidirectional bit buffer circuits each of the bidirectional bit buffer circuits including, 1) a first data path comprising a receiver having an input connected to the first data bus and an output connected to a circuit node, latch means having a terminal connected to the circuit node for selectively holding data at the circuit node, and a driver having an input connected to the circuit node and an output connected to the second data bus, 2) a second data path comprising a receiver having an input connected to the second data bus and an output connected to a circuit node, latch means having a terminal connected to the circuit node for selectively holding data at said circuit node, and a driver having an input connected to the circuit node and an output connected to the first data bus, 3) means for controlling the drivers to selectively place the output of the drivers in an active driving or high impedance state, and 4) means for controlling each of the data latches to selectively hold data at the corresponding circuit node or to permit the output of the receiver at the corresponding circuit node to vary the data at the corresponding circuit node; and parity generating means connected at the first data path circuit node in each of the bidirectional bit buffer circuits for generating a parity signal responsive to the data at the first data path circuit nodes.

The invention has particular application in a computer for communicating data between two data buses.

BRIEF DESCRIPTION OF THE DRAWINGS

These and other objects, features, and advantages of the invention will be apparent from a consideration of the following description and drawings, in which:

FIG. 2 is a block diagram of a buffer and parity generating circuit constructed in accordance with the present invention;

FIG. 3B is a schematic diagram of the driver circuit of FIG. 2 implemented in bipolar transistor logic;

FIG. 4 is a block diagram of a transparent latch circuit constructed in accordance with the prior art; and FIG. 5 is a simplified block diagram illustrating the logical connections of the transparent latch circuit constructed in accordance with the present invention.

DETAILED DESCRIPTION OF THE INVENTION

Figure 1:
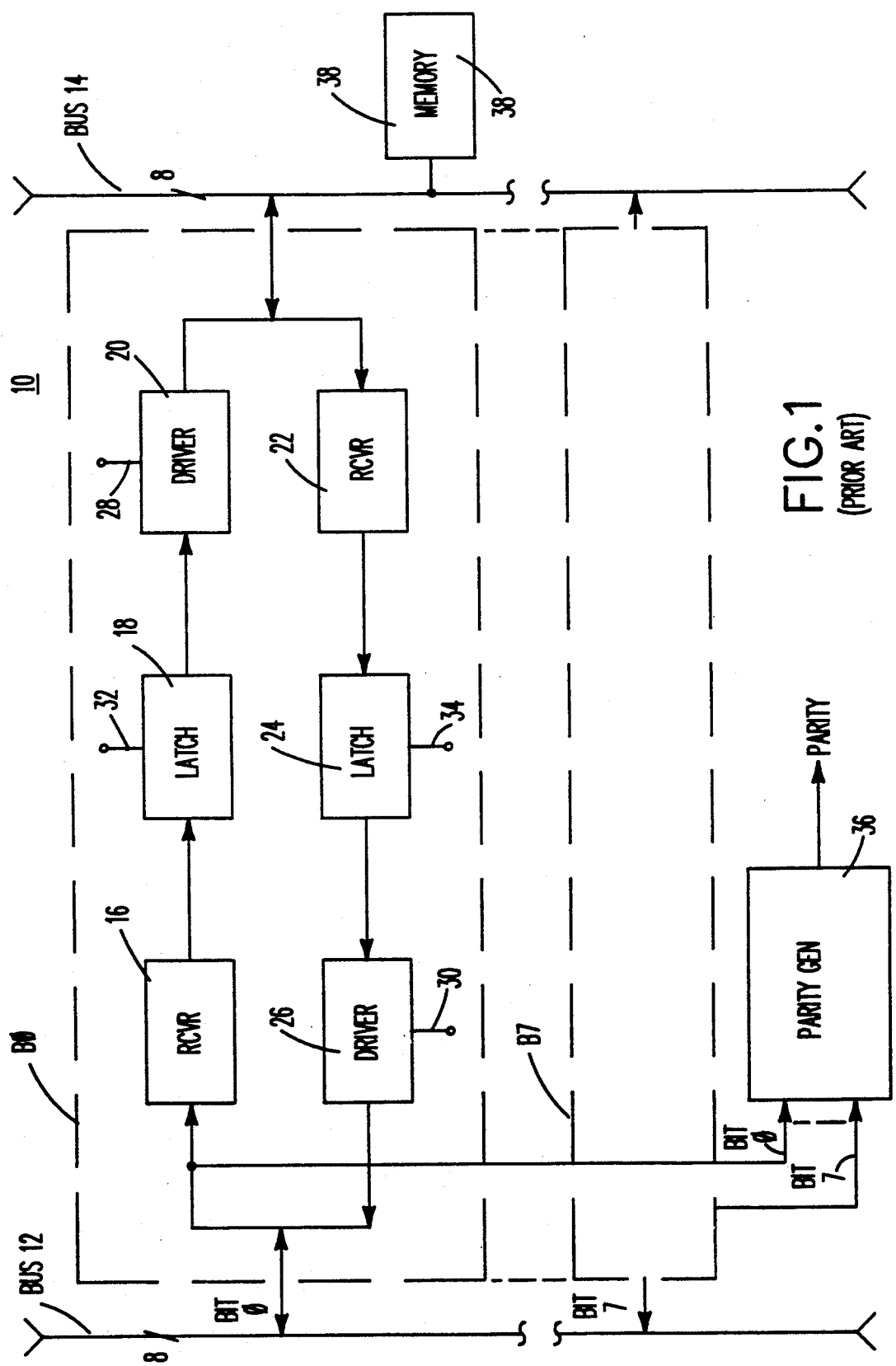
FIG. 1 is a block diagram of a buffer and parity generating circuit constructed in accordance with the prior art and described hereinabove.

Referring now to FIG. 2, a circuit 50 constructed in accordance with the present invention comprises eight bidirectional bit buffer circuits C0–C7 connected intermediate a pair of data buses 52, 54, and a parity generating and checking circuit 56. Circuits C0–C7 may conveniently be identical in construction, each bidirectionally buffering a single bit line (not shown) between data buses 52, 54. For purposes of explanation, only circuit C0 is shown and described in detail.

Circuit C0 comprises two parallel connected data paths, the first path comprising a receiver 57 having an input connected to bus 52 and an output connected at a circuit node N1, a latch 58 connected at circuit node N1, and a driver 60 having an input connected at circuit node N1 and an output connected to bus 54. The second data path in circuit C0 comprises a receiver 62 having an input connected to bus 54, an output connected to a circuit node N2, a latch connected at circuit node N2, and a driver 66 having an input connected at circuit node N2 and an output connected to bus 52. Drivers 60, 66 each include a control terminal 61, 67, respectively, for selectively placing their outputs in either an active driving or high impedance state. Latches 58, 64 each include a control terminal 59, 63, respectively, for selectively latching or passing through the data at circuit nodes N1, N2, respectively. Preferred embodiments of these components are described herein below.

Continuing to describe FIG. 2, a parity generating circuit 68 is connected at circuit node N1 of circuit C0, and to the corresponding circuit nodes in circuits C1–C7. Parity generator 68 is thus positioned to generate a parity bit responsive to the data held at the circuit nodes by the latches. Parity generator 68 preferably comprises a logical exclusive-NOR tree of the type shown in IBM Technical Disclosure Bulletin Volume 16, No. 10, page 3249.

Parity generator 68 is connected at its output to both the input of a parity driver circuit 70 and the input of a logical exclusive-NOR gate 72. Parity driver circuit 70 includes a control terminal 73 for selecting an active driving or high impedance output state, this control terminal being connected to the output of a gen/chk (i.e. generate or check parity) receiver 74 and to an enable terminal 76 on gate 72. A parity receiver 78 has an input 79 connected in common with the output of parity driver 70, and an output connected to a second input of gate 72. An error driver 80 is connected at its input to the output of gate 72. For purposes of explanation, a memory device 84, for example a dynamic RAM memory, is shown connected to bus 54. Gate 72, receivers 74, 78, and drivers 70, 80 comprise conventional circuits.

In operation, through the application of appropriate signals to latch control terminals 59, 63, driver control terminals 61, 67, 73, and the inputs for receivers 74, 78, circuit 50 can be operated to generate parity for data on either of buses 52, 54 without interrupting the operation of the buses. Circuit 50 can further be operated to check the parity of data on either of the buses against a stored parity bit. Upon consideration of the operation of circuit 50 as described below, many useful buffering and parity related functions will become apparent to the reader.

For purposes of explanation, the operation of circuit 50 will now be described with respect to block diagram FIG. 2. Described first will be the operation of circuit 50 required to generate a parity bit responsive to the data on bus 52 and drive that parity bit with the associated data onto bus 54. To perform this function, control terminal 59 is operated to hold the data on bus 52 in latch 58, the data thus being held constant at circuit node N1, bus 52 then being free for subsequent data communication. Driver 60 is controlled via terminal 61 to place it in its high impedance state while it is desired to keep bus 54 otherwise active, and to place it in its active driving state when it is desired to drive the latched data out onto the bus. Gen/chk receiver 74 is controlled to disable gate 72. Parity generator 68 functions to generate at its output a parity bit responsive to the bits available at the input of drivers 60 in circuits C0–C7. This parity bit is made available at the output 79 of parity driver 78. In accordance with a main advantage of the present invention, the parity of data on bus 52 is thus generated and made available with that data, without interrupting the operation of either bus 52 or bus 54. Further, as will be appreciated from a consideration of FIGS. 4 and 5 below, the data is latched at circuit node N2 without any delay being introduced between receiver 57 and driver 60 by latch 58.

If it is desired to check the parity of data on bus 52 against a previously generated and stored parity bit (for example stored in memory 84), circuit 50 is operated in a manner identical to that described above, with the exception that gen/chk receiver 74 is operated to enable gate 72 and disable parity driver 70. The stored parity bit is applied to input terminal 79 of parity receiver 78, and is thus compared with the output of parity generator 68 at gate 72. If the stored parity bit does not compare with the newly generated parity bit, an error signal, i.e. a logical zero, is driven at the output of error driver 80.

Next will be described the operation of circuit 50 for generating and driving parity responsive to the data on bus 54. To perform this operation, control terminal 63 is operated to place latch 64 in the transparent mode. That is, latch 64 is controlled so as to permit the output of receiver 57 to directly vary the data at circuit node N1. Driver 66 is placed in its active state, and control terminal 59 is operated to hold data from bus 54 in latch 58, thus holding the data constant at circuit node N2. Once the data from bus 54 is held in latch 58, control terminals 61, 67 of drivers 60, 66 are operated to free buses 52, 54 for further data communications. Gen/chk receiver 74 is operated to place circuit 56 in the parity generating mode as described above. Operated thusly, a parity bit responsive to the data on bus 54 will be generated by parity generator 68 and made available at terminal 79. The corresponding data is available at the output of latch 58, and can be read on bus 54 through driver 60, or on bus 52 through driver 60, receiver 62, and driver 66. It will thus be understood that the parity for data on bus 54 can be generated without interrupting the communication of data on either of buses 52 or 54.

The parity of data on bus 54 can be checked against a stored parity bit by operating circuit 50 in a manner identical to that describe above, with the exception that gen/chk receiver 74 is operated to disable parity driver 70 (i.e. place it in the high impedance state) and place gate 72 in the active mode and hence check data.

It will thus be apparent that, through appropriate control of the latches and drivers in circuit 50, parity can be generated and checked, for data on buses 52, 54, without stopping the data communications on the buses. It will be understood that, for many data communications, it is not necessary to keep both data buses 52, 54 free during generating or checking of parity. For example, when bus 52 is waiting on data from bus 54, it may not be necessary to keep bus 52 uninterrupted. In such circumstances, parity can be generated or checked without latching data in latches 58, 64. For such a data transfer from bus 54 to bus 52, latches 58, 64 can be set in the transparent mode, and driver 66 placed in its active state. Data is then held on bus 54 for a time sufficient to permit parity generator 68 to function. Parity generator 68 then generates a parity bit responsive to the data on bus 54, and makes that parity bit available at output terminal 79, with the data at driver 66.

It will be understood that, depending on the data transfer and parity generating/checking requirements, circuit 50 can be operated to perform a variety of functions. More such functions not already described above are set out in Table 1 below, wherein: X indicates that the controllable status of a component is irrelevant, Hi-Z indicates a high impedance state for a driver, and the remainder of the description is self-explanatory from a consideration of the above.

TABLE 1

| Latch 58 | Latch 64 | Driver 66 | Driver 60 | RCVR 7 | Gen/Chk Parity Function |
|---|---|---|---|---|---|
| Trans | X | HI-Z | X | CK | check parity on data on bus 52 |
| Trans | Trans | Active | HI-Z | CK | check parity on data on bus 54 |
| Trans | X | HI-Z | Active | Gen | generate parity from data on bus 52 |
| Trans | Trans | Active | HI-Z | Gen | generate parity from data on bus 54 |

Referring now to FIG. 3, preferred embodiments of the receivers 57, 62, latches 58, 64, and drivers 60, 66 are shown. For purposes of explanation, the reference numbers from the first set of components are used. It will be seen that latch 58 and driver 60 comprise significant inventions in and of themselves.

RECEIVER

Describing first receiver 57, a transistor T2 has an input terminal 90 connected at the collector thereof, and a shorted base-emitter junction connected to the base of a transistor T4. A supply voltage, indicated as $V_{cc}$ throughout, is supplied to the base of transistor T4 through a resistor R2, and to the collector of the transistor through a resistor R4. The base of transistor T4 is grounded to a circuit ground through a capacitor C2.

Continuing to describe receiver 57, the emitter of transistor T4 is connected to the base of a transistor T6, the latter transistor having its emitter connected to the collector of a transistor T8. Transistor T8 is shorted across its collector-base junction, and both transistors T6 and T8 have Schottky diodes D2, D4, respectively, connected across their their base-collector junctions. A resistor R6 is connected intermediate the base of transistor T6 and the collector of transistor T8, and a resistor R8 is connected between the collector of transistor T8 and ground. Supply voltage $V_{cc}$ is supplied to the collector of transistor T6 through a resistor R10.

In operation, when a logical 0 is applied to the collector terminal 90 of transistor T2, T2 functions as a diode drop. With standard TTL logic levels (i.e. logical low/0=0.6 V, logical hi/1=2.4 V, $V_{cc}$=5 V), the emitter of transistor T2 sits at one diode drop above the collector, or about 1.4 volts. The emitter of transistor T4 is sitting at two diode drops above ground, and hence the transistor remains in an off state. The collector of transistor T6, indicated herein as circuit node A, is at a logical 1. When a logical 1 is applied to receiver 57 at terminal 90, the emitter of transistor T2 is at a voltage sufficient to turn on transistors T4, T6, and T8, driving node A to a logical 0. It is thus seen that the "output" of receiver 57, i.e. the logic level at node A, is the inverse of the input at terminal 90.

LATCH

Referring now to FIGS. 4 and 5 in addition to FIG. 3, FIG. 4 shows a simplified block diagram of a prior art "transparent" latch 94 connected intermediate, for example, a receiver 92 and driver 96. Even though the latch can be activated to pass data through without holding (hence its name "transparent"), it still includes transistors (not shown) in series between the input device (receiver 92) and the output device (driver 96). Even when latch 94 is operated in the pass-through mode, these transistors contribute an undesirable delay to the data.

Referring now to FIG. 5, a simplified block diagram of receiver 57, latch 58, and driver 60 illustrates that, with the latch of the present invention, no transistors are positioned intermediate the input (receiver 57) and output (driver 60) of the latch. Receiver 57, latch 58, and driver 60 are effectively connected in a T-type connection to node A. Hence, latch 58 contributes no significant delay in the signal path between receiver 57 and driver 60.

Referring now to FIG. 3, latch 58 includes a transistor T10 connected at its collector to the base of transistor T6. A Schottky diode D6 is connected across the base-collector junction of transistor T10. The emitter of transistor T10 is connected in parallel to the collector of transistor T8 and to ground through a capacitor C4.

The base of transistor T10 is connected to a transistor T12 through a pair of series-connected resistors R12, R14, the junction of the resistors comprising a control terminal indicated at 98. Transistor T12 has its base connected to the collector of a transistor T14, and its emitter connected in common to the the emitter of transistor T14 and to the shorted base-emitter junction of a transistor T16. Schottky diodes D8, D10, and D12 are connected across the base-collector junctions of transistors T12, T16, and T14, respectively. The collector/cathode connection of transistor T16 and diode D10 is connected to ground, and the base of transistor T14 is connected to circuit node A through a resistor R16.

In operation, a logical high signal is applied to terminal 98 to activate latch circuit 58 to hold the logical signal present at node A. Describing first the latching of a logical 0 at node A, with control terminal 98 low, transistors T4 and T6 are on, and hence node A is pulled to a logical low state and transistor T14 turned off. When a logical high signal is applied to terminal 98, transistors T10 and T12 turn on, the collector of transistor T10 is pulled to a logical low state, and transistor T6 is turned off. Node A is thus latched at a logical low (or 0) state regardless of any changes at input terminal 90 of receiver 57.

Describing now the latching of a logical 1 at node A, with control terminal 98 at a logical low, T6 is off and T14 is on. T12 and T10 are off. Thus, the voltage at node A represents a logical high. When a logical high signal is applied to terminal 98 to enable the latch, transistor T14 holds transistor T12 in an off state. Transistor T10 is, however, turned on and holds transistor T6 off. With transistors T12 and T6 off, node A is held at a logical high regardless of the inputs to receiver 57 on terminal 90.

It is thus seen that the basic holding action of latch circuit 58 is effected by the above described connection of transistors T12, T14, as controlled by the signal applied to terminal 98 to hold the logical signal at node A. Transistor T16 functions solely as diode D10 to raise the emitters of transistors T12, T14 one Schottky diode drop above ground. Transistor T10 functions to provide a signal at its collector for feeding back to and disabling receiver 57 so as to prevent any changes at input 90 of the receiver from appearing at node A.

DRIVER

Referring now to FIG. 3B, a new and inventive circuit arrangement for driver 60 is shown, the circuit generally comprising seven functional components: a phase splitter 100, impedance controller 102 (shown in two separate blocks), high level driver 104, low level driver 106, DC up-level clamp 108, beta degradation clamp 110, and overshoot clamp 112. For purposes of description, the functional components of driver 60 are generally described as indicated below.

PHASE SPLITTER

Figure 3A:
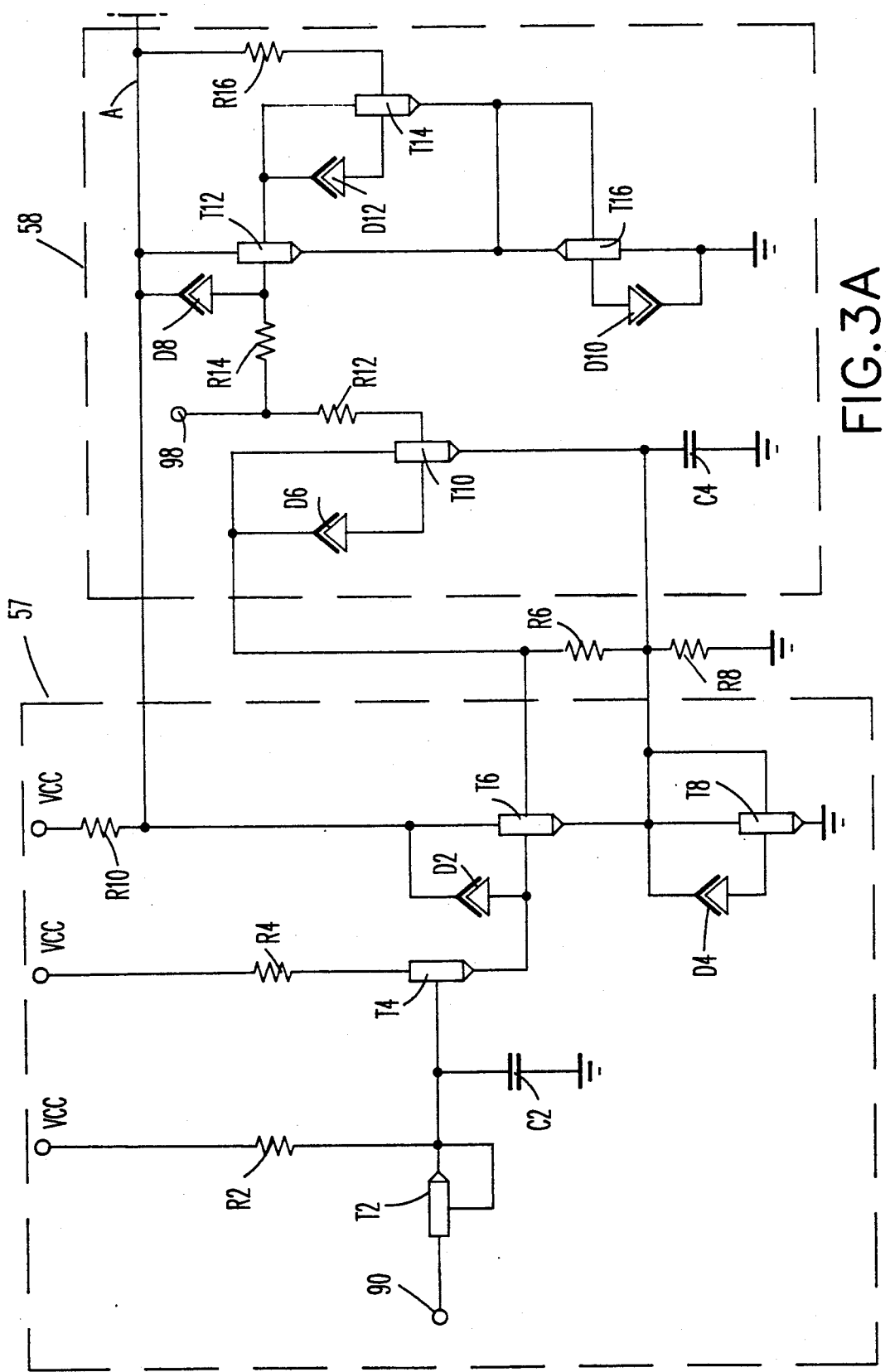
FIG. 3A is a schematic diagram of the receiver and latch circuits of FIG. 2 implemented in bipolar transistor logic.

Examining first phase splitter 100, a transistor T20 has its base connected to the emitter of a transistor T22, this junction being connected to circuit node A (FIG. 3A). A pair of Schottky diodes, D20, D22, are connected across the base-collector junctions of transistors T20, T22, respectively. As will be described in further detail hereinbelow, it is this new and improved arrangement of phase splitter 100 which provides driver 60 with increased speed for comparable power in comparison to prior art drivers.

HIGH LEVEL DRIVER

The collector of transistor T20 is connected to the base of a transistor T24 in high level driving circuit 104, and to supply voltage $V_{cc}$ via a resistor R20. The collector of transistor T24 is connected to supply voltage $V_{cc}$ through a resistor R22, and to the collector of a transistor T26. The emitter of transistor T24 is connected to the base of transistor T26.

LOW LEVEL DRIVER

The base of transistor T22 in phase splitter 100 is connected through a pair of series connected resistors R24, R26 to the collector of a transistor T28 in low level driver 106, the junction of the resistors being connected to supply voltage $V_{cc}$. The collector of transistor T22 is connected to the base of transistor T28, and the emitter of the latter transistor is connected to circuit ground through a resistor R28. The base of transistor T28 is connected to the collector of a transistor T30 through a capacitor C20. The base of transistor T30 is connected to the emitter of transistor T28, and to the emitter of transistor T26 through a Schottky diode D24. The emitter of transistor T30 is connected directly to the circuit ground.

IMPEDANCE CONTROLLER

Impedance controller circuit 102 comprises two circuit portions, the first including a pair of transistors T32, T34 having their collector-emitter paths connected in series between the collector of transistor T22 and ground. The base-emitter junction of transistor T34 is shorted in parallel with a Schottky diode D26. A Schottky diode D28 is connected across the base-collector junction of transistor T32, and a control terminal 120 is connected to the base of the transistor through a resistor R30. This portion of the circuit functions, as described in further detail hereinbelow, with low level driver circuit 106.

A second portion of impedance controller circuit 102 comprises a pair of transistors T36, T38, and a pair of Schottky diodes D30, D32. These components are connected in an identical arrangement to transistors T32, T34, and diodes D32, D34, respectively, as described above, with the exception that they are connected to operate with high level driver circuit 104. Accordingly, the collector of transistor T36 is connected in common to the base of transistor T24 and to the collector of transistor T20. The base of transistor T38 is connected to the emitter of transistor T20, and the emitter of transistor T38 is connected to ground.

DC CLAMP

DC clamp circuit 108 comprises a single transistor T40 having its collector connected to the base of transistor T24 through a resistor R32. A Schottky diode D36 is connected across the base-collector junction of transistor T40, with the anode of diode D36 connected to circuit ground through a resistor R34. The base of transistor T40 is further connected through a resistor R36 to the emitter of transistor T24. The emitter of transistor T40 is connected to circuit ground.

OVERSHOOT CLAMP

Overshoot clamp 112 comprises a transistor T42 having its collector and base connected to the collector and base of transistor T24, respectively. A Schottky diode D38 is connected across the collector-base junction of transistor T42, and the transistor is connected at its emitter to the base of a transistor T44 through a resistor R40. The emitter of transistor T44 is connected to circuit ground, and the collector of the transistor is connected to the emitter of a transistor T46. A pair of resistors R42, R44 are connected in series between the emitter and collector of transistor T46, with the junction of the resistors being connected to the transistor base. The collector of transistor T46 is connected to a terminal 122, the terminal comprising the output terminal for driver 60.

BETA DEGRADATION CLAMP 110

Beta degradation clamp 110 includes a transistor T48 connected at its emitter to the emitter of transistor T24 and the base of transistor T26. The base-collector junction of transistor T48 is shorted, and connected to the emitter of a transistor T50. A Schottky diode D41 is connected across the base-collector junction of transistor T50, the base of the transistor further being connected to the emitters of a pair of transistors T52, T54. The base-collector junction of transistor T52 is shorted and connected to the emitter of transistor T26. The base-emitter junction of transistor T54 is shorted. A Schottky diode D40 is connected across the base-collector junction of transistor T54, the collector of the transistor being connected to the emitter of transistor T26 and to terminal 122. A transistor T55 has its emitter connected to the collector of transistor T50, and a shorted base-collector junction connected to supply voltage $V_{cc}$.

DRIVER OPERATION

In operation, the output of driver 60 at terminal 122 is the inverse of the logical input at node A, thereby compensating for the signal inversion performed in receiver 57 as described above.

Describing first the driving of a logical low output on terminal 122, the logical input at node A is high. The high input at node A turns transistors T20 and T38 on. Transistors T24 and T26 in high level driving circuit 104 are turned off. Transistor T22 turns off, and diode D22 turns on turning on transistors T28, T30 in low level driving circuit 106. The collector of transistor T30 pulls output terminal 122 to a logical low level.

Describing next the driving of a logical high output on terminal 122, the logical input at node A is low. Transistors T20 and T38 turn off, and transistor T22 turns on, turning off transistors T28 and T30 in low level driving circuit 106. Transistors T24 and T26 in high level driving circuit 104 are switched on. Thus, the emitter of transistor T26 places output terminal 122 at a logical high signal level. Capacitor C20 controls the rate of change between high and low logic levels at output terminal 122.

The basic operation having been described above, the operation of the various clamps and control circuits will now be described.

Beta degradation clamp circuit 110 functions to prevent an excessive bias voltage from forming across the emitter-base junction of transistor T12, and hence degrading the beta of the transistor. In operation, transistors T48, T50, and T52 function as diode drops, while transistors T50 and T55 supply current flow which is directed through resistors R34, R36. The potential at the base of T26 is thus raised to limit the reverse bias voltage.

DC clamp circuit 108 functions as a conventional Baker clamp to limit the maximum voltage of a logical high signal at output terminal 122. In operation, when T24 is turned on by the application of a logical low at node A, resistors R36, R34 and transistor T40 function to limit the base current of transistor T24.

Overshoot clamp circuit 112 functions to limit excessive ringing on and hence quiet a logical high signal on output terminal 122. In operation, transistors T42, T44 are on when a logical low signal is present at node A. If overshoot or ringing occurs, transistor T46 turns on and sinks current at terminal 122, quieting the signal on the terminal.

Finally, impedance controller circuit 102 functions, upon the application of a logical high control signal to terminal 120, to place output terminal 122 of driver 60 in a high impedance state. In operation, when a logical high signal is applied to terminal 120, transistors T36 and T38 turn on and hold transistor T26 in high level driver circuit 104 off. Simultaneously, transistors T32, T34 turn on and hold transistors T28, T30 in low level driving circuit 106 off. Terminal 122 thus presents a high impedance to any driven loads (not shown).

In summary, the operation of driver circuit 60, with the new and improved phase splitter circuit 100, has been found to provide substantially increased speed at comparable power consumption in comparison to prior art devices.

There is thus provided a new and improved electronic circuit for buffering and parity checking digital data communicated between data buses. The circuit permits parity generation and checking to be performed without substantially interrupting the communication of data on either of the buses. The circuit is also very flexible in nature, permitting, through appropriate control, a wide variety of parity generation and checking functions to be performed. The circuit has particular application for buffering and parity checking data communicated between data buses in computers. When the circuit is implemented using the preferred embodiments of the receiver, latch, and driver components described above, it provides the advantages of being very fast while consuming an acceptable level of power.

While the present invention has been described with respect to a particular embodiment, it will be understood that the invention is not so limited. For example, while preferred embodiments of the receiver, latch, and driver circuits have been shown implemented in TTL logic with NPN bipolar transistors, these circuits can likewise be implemented in other logic types such as PNP bipolar transistors or field effect transistors (FETs). It will be understood by those skilled in the art that various changes in form and scope of the described embodiment may be made without departing from the spirit and scope of the invention.

We claim:

1. Apparatus for buffering and parity checking digital data communicated between first and second data buses, comprising:
 a plurality of bidirectional bit buffer circuits, each of said bidirectional bit buffer circuits including,
 a first data path comprising a receiver having an input connected to said first data bus and an output connected to a circuit node, latch means having a terminal connected to said circuit node for selectively holding data at said circuit node, and a driver having an input connected to said circuit node and an output connected to said second data bus, a second data path comprising a receiver having an input connected to said second data bus and an output connected to a circuit node, latch means having a terminal connected to said circuit node for selectively holding data at said circuit node, and a drier having an input connected to said circuit node and an output connected to said first data bus, means for controlling said drivers to selectively place the output of said drivers in an active driving or high impedance state, and means for controlling each of said data latches to selectively hold data at the corresponding circuit node or to permit the output of the receiver at the corresponding circuit node to vary the data at the corresponding circuit node; and parity generating means connected at said first data path circuit node in each of said bidirectional bit buffer circuits for generating a parity signal responsive to the data at said first data path circuit nodes.

2. Apparatus in accordance with claim 1 and further including error detecting means connected to the output of said parity generating means for comparing said parity signal with a second parity signal and producing an error signal if the two parity signals are not identical.

3. Apparatus in accordance with claim 2 wherein said error detecting means comprises:

a logical exclusive-OR gate having a first input connected to the output of said parity generator; and means for applying said second parity signal to a second input of said exclusive-OR gate.

4. Apparatus in accordance with claim 3 wherein said second parity signal applying means comprises:

a parity terminal for receiving said second parity signal;

a parity receiver connected at its input to said parity terminal and at its output to said second input of said exclusive-OR gate; and a parity driver having an input connected to the output of said parity generating means and an output connected to said parity terminal.

5. Apparatus in accordance with claim 4 wherein said second parity signal applying means further comprises a control receiver having an output connected both to the control terminal of said parity driver and to the enable terminal of said exclusive-OR gate.

6. Apparatus in accordance with claim 1 wherein:

each of said drivers includes a phase splitting circuit connected to its corresponding receiver and latch at said circuit node.

7. Apparatus in accordance with claim 1 wherein said latch circuit in each of said data paths further includes means connected to the receiver in the data path for disabling said receiver when said latch is actuated to hold data at the corresponding circuit node.

8. In a computer including at least first and second data buses for communicating data, apparatus for buffering and parity checking digital data communicated between first and second data buses, comprising:

a plurality of bidirectional bit buffer circuits, each of said bidirectional bit buffer circuits including, a first data path comprising a receiver having an input connected to said first data bus and an output connected to a circuit node, latch means having a terminal connected to said circuit node for selectively holding data at said circuit node, and a driver having an input connected to said circuit node and an output connected to said second data bus, a second data path comprising a receiver having an input connected to said second data bus and an output connected to a circuit node, latch means having a terminal connected to said circuit node for selectively holding data at said circuit node, and a driver having an input connected to said circuit node and an output connected to said first data bus, means for controlling said drivers to selectively place the output of said drivers in an active driving or high impedance state, and means for controlling each of said data latches to selectively latch data at the corresponding circuit node or to permit said output of said receiver at the corresponding circuit node to vary the data at the corresponding circuit node; and parity generating means connected at said first data path circuit node in each of said bidirectional bit buffer circuits for generating a parity signal responsive to the data at said first data path circuit nodes.

9. Apparatus in accordance with claim 8 wherein:

each of said drivers includes a phase splitting circuit connected to its corresponding receiver and latch at said circuit node.

10. Apparatus in accordance with claim 8 wherein said latch circuit in each of said data paths further includes means connected to the receiver in the data path for disabling said receiver when said latch is actuated to hold data at the corresponding circuit node.

* * * * *